United States Patent
Wong et al.

[11] Patent Number: 5,936,901
[45] Date of Patent: Aug. 10, 1999

[54] SHARED DATA LINES FOR MEMORY WRITE AND MEMORY TEST OPERATIONS

[75] Inventors: Victor Wong, Boise; Charles L. Ingalls, Meridian; Jeffrey P. Wright; Timothy B. Cowles, both of Boise, all of Id.

[73] Assignee: Micron Technology, Inc., Boise, Id.

[21] Appl. No.: 09/044,166

[22] Filed: Mar. 19, 1998

[51] Int. Cl.[6] .................................................. G11C 7/00
[52] U.S. Cl. ................................... 365/201; 365/189.07
[58] Field of Search .............................. 365/189.07, 201, 365/230.03; 371/21.1, 21.2

[56] References Cited

U.S. PATENT DOCUMENTS

| | | | |
|---|---|---|---|
| 5,400,342 | 3/1995 | Matsumura et al. | 371/21.2 |
| 5,436,911 | 7/1995 | Mori | 371/21.1 |
| 5,457,696 | 10/1995 | Mori | 371/21.3 |
| 5,548,596 | 8/1996 | Tobita | 371/21.2 |
| 5,646,948 | 7/1997 | Kobayashi et al. | 371/21.2 |
| 5,673,270 | 9/1997 | Tsujimoto | 371/21.1 |
| 5,684,809 | 11/1997 | Stave et al. | 371/27 |
| 5,689,514 | 11/1997 | Saitoh | 371/21.2 |

Primary Examiner—Son Mai
Attorney, Agent, or Firm—Dickstein Shapiro Morin & Oshinsky LLP

[57] ABSTRACT

The present invention is embodied in a method and apparatus which permits the testing of a memory device by utilizing normally unused data write lines to conduct the results of the memory test operations to a memory controller or processor. The data read from a specific memory cell is input into a comparator through a data sense amplifier and compared to the data from another memory cell. When the data is not coincident, a switch is enabled causing a data write line to change states. The change of state of the data write line disables a buffer, causing it to output a tri-state signal. A controller detects and interprets the tri-state signal output from the buffer as improper memory functioning.

25 Claims, 4 Drawing Sheets

SHARED DATA LINES FOR MEMORY WRITE AND MEMORY TEST OPERATIONS

FIELD OF THE INVENTION

The present invention relates to a semiconductor memory, and in particular to a method and apparatus for testing a semiconductor memory by utilizing normally idle data write lines to conduct the data output results of a memory test to a memory controller.

BACKGROUND OF THE INVENTION

Memory tests on random access memory (RAM) integrated circuits, such as DRAMs and SRAMs and the like are typically performed by the manufacturer during production and fabrication and also by a downstream manufacturer of a computer or processor controlled system as well as by an end-user during computer initialization to determine if the circuits are operating as intended. The testing is typically performed by a memory controller or processor (or a designated processor in a multi processor machine) which runs a testing program.

Random access memories are usually subjected to data retention tests and/or data march tests. In data retention tests, every cell of the memory is written and checked after a pre-specified interval to determine if leakage current has occurred that has affected the stored logic state. In a march test, a sequence of read and/or write operations is applied to each cell, either in increasing or decreasing address order. Such testing ensures that hidden defects will not be first discovered during operational use, thereby rendering end-products unreliable. In order to reduce the number of address lines and time required to conduct a memory test, the memory test may be done in a so-called compressed mode in which banks of memory locations are tested in parallel, with the memory locations of one bank being tested against those of another, rather than one at a time.

An example of a conventional compressed memory test circuit is shown in FIG. 1. A random access memory device includes multiple bank memory arrays 10. Each array includes storage cells organized in rows and columns for storing data. Each storage cell is addressable, i.e. responsive to address select signals. Address specification is made by a row decoder and a column decoder (not shown), which are commonly shared by memory arrays.

When placed in a memory test mode, a predetermined test data pattern consisting of high binary logic voltage levels (high logic levels) and/or low binary logic voltage levels (low logic levels) is written concurrently into each cell of the bank of memory arrays 10. The test data stored in each cell is subsequently read from each cell and compared to data read from a parallel bank memory array cell by comparators 12 to determine if the compared data is in a mutually identical logic state. A properly functioning memory will have stored the identical logic state in each cell. The comparators 12 will output a signal based upon the coincidence or non coincidence of the compared data. The compared data is outputted on data lines 16 by MUX 14. Data lines 16 are connected to error detection circuits 18. Should the data from each compared cell not be coincident, indicating a defective memory cell, error detection circuit 18 will output a signal on one of a plurality of error detection lines 22, 27. The error detection lines 22, 27 are connected to tri-state data control lines 24 via logic circuitry 26. The tri-state data control lines are connected to outputs DQ0–DQ3. The outputs DQ0–DQ3 are connected to a controller or processor 20.

The signal output from outputs DQ0–DQ3 can be in one of three states: a HIGH logic level indicating a high binary logic voltage level, a LOW logic level indicating a low binary logic level, or a high impedance level, also known as a tri-state signal, in which case the lines do not cause any loading or sinking of the associated circuitry. If the compared data is coincident, indicating proper memory cell functioning, a signal as determined by the error indicating circuit 18 will be sent to the logic circuitry 26 via the error indicating lines 22, 27. The logic circuitry 26 will output a signal via tri-state data control lines 24 to outputs DQ0–DQ3. Outputs DQ0–DQ3 will conduct either a HIGH logic level or a LOW logic level to a controller 20, which will be interpreted by the controller 20 as a proper memory function signal. Should the compared data be non coincident, indicating a memory cell failure, a different signal than that indicating coincidence of data will be sent to the logic circuitry 26 from the error indicating circuit 18 via the error indicating lines 22, 27. The logic circuitry will output a signal representing a memory failure to outputs DQ0–DQ3 via tri-state data control lines 24. Outputs DQ0–DQ3 will conduct a tri-state signal to controller 20. The controller will interpret this signal as a memory operation failure.

The circuitry necessary for performing a memory test is required to be built onto the memory device. Lines dedicated solely for the error detection signals are typically provided, occupying space on the memory device. Although the read compression technique can be used to some extent to reduce the number of addressing lines needed for the memory test, memory devices of increasingly larger storage capacities or higher bandwidths have been developed which of necessity increases the number of data lines required for addressing and for providing the error test results to the processor or controller. As the memory devices include increasingly greater number of memory cells, there is a corresponding increase in the size of the memory device necessary to accommodate the additional circuitry and associated test lines. Thus, the problem exists of how to maintain the memory test function while utilizing decreased space within the device for the necessary associated testing circuitry.

The present invention has been designed to overcome some of the limitations associated with memory testing functions.

SUMMARY OF THE INVENTION

The present invention advantageously provides a method and apparatus which permits the testing of a memory device utilizing normally unused data write lines to conduct the results of the memory test operations to a memory processor or controller, thus decreasing the amount of data lines necessary within the memory integrated circuit. Specifically, write data lines can be used to conduct data representing the results of the memory test, whenever the data read and data write lines are not shared, thus removing the necessity for separate memory test data lines.

In a conventional memory design, the data write and data read lines are not, and indeed cannot, be active simultaneously. When a read operation is in progress, the data read lines are used to output data, while the data write lines are in an idle state.

Thus, in one aspect the invention provides a memory apparatus in which during a memory test operation, which may use a read compression technique, the idle data write lines are used to enable a buffer, which outputs tri-state data representing the results of the memory test to a memory processor or controller.

In yet another aspect the invention provides a method of operating a memory device in which during a memory test operation the results of the memory test are provided on the conventional unused data write lines to a memory processor or controller via a buffer.

In accordance with the present invention, a memory test is conducted by comparing from parallel read memory arrays predetermined test data previously written into the memory cells. Non-coincident data will cause a now shared data write/tri-state control line (normally idle during read operations) to change states, causing a buffer to output a signal indicating a memory error to a memory processor or controller.

The above and other objects, advantages and features of the invention will become more readily apparent from the following detailed description of the invention which is provided in connection with the accompanying drawings.

DETAILED DESCRIPTION OF PREFERRED EMBODIMENTS

The present invention will be described as set forth in the preferred embodiments illustrated in FIGS. 2–4. Other embodiments may be utilized and structural or logical changes may be made without departing from the scope of the present invention.

Figure 1:
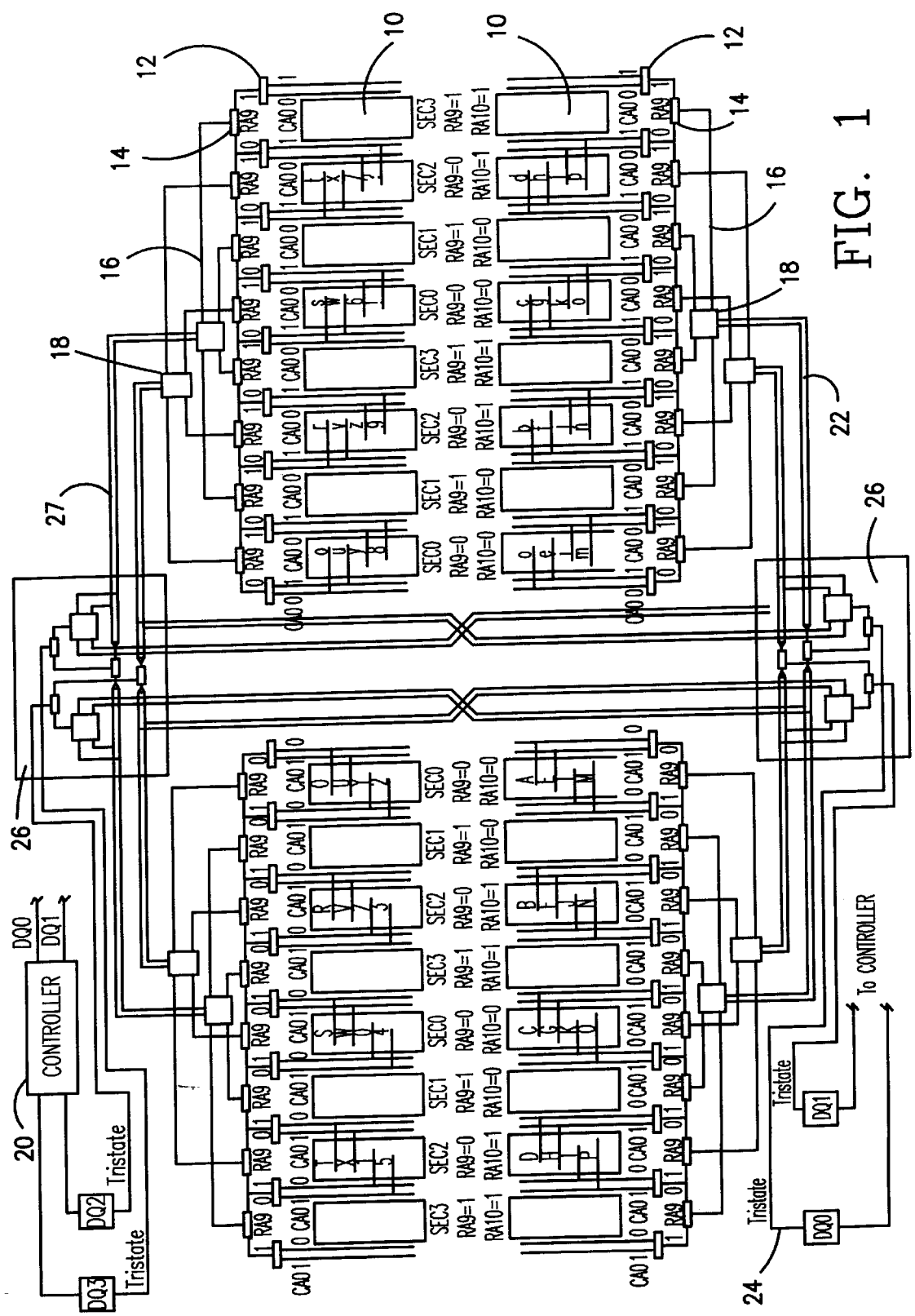
FIG. 1 is a schematic block diagram of a conventional compressed memory test circuit.
Figure 2:
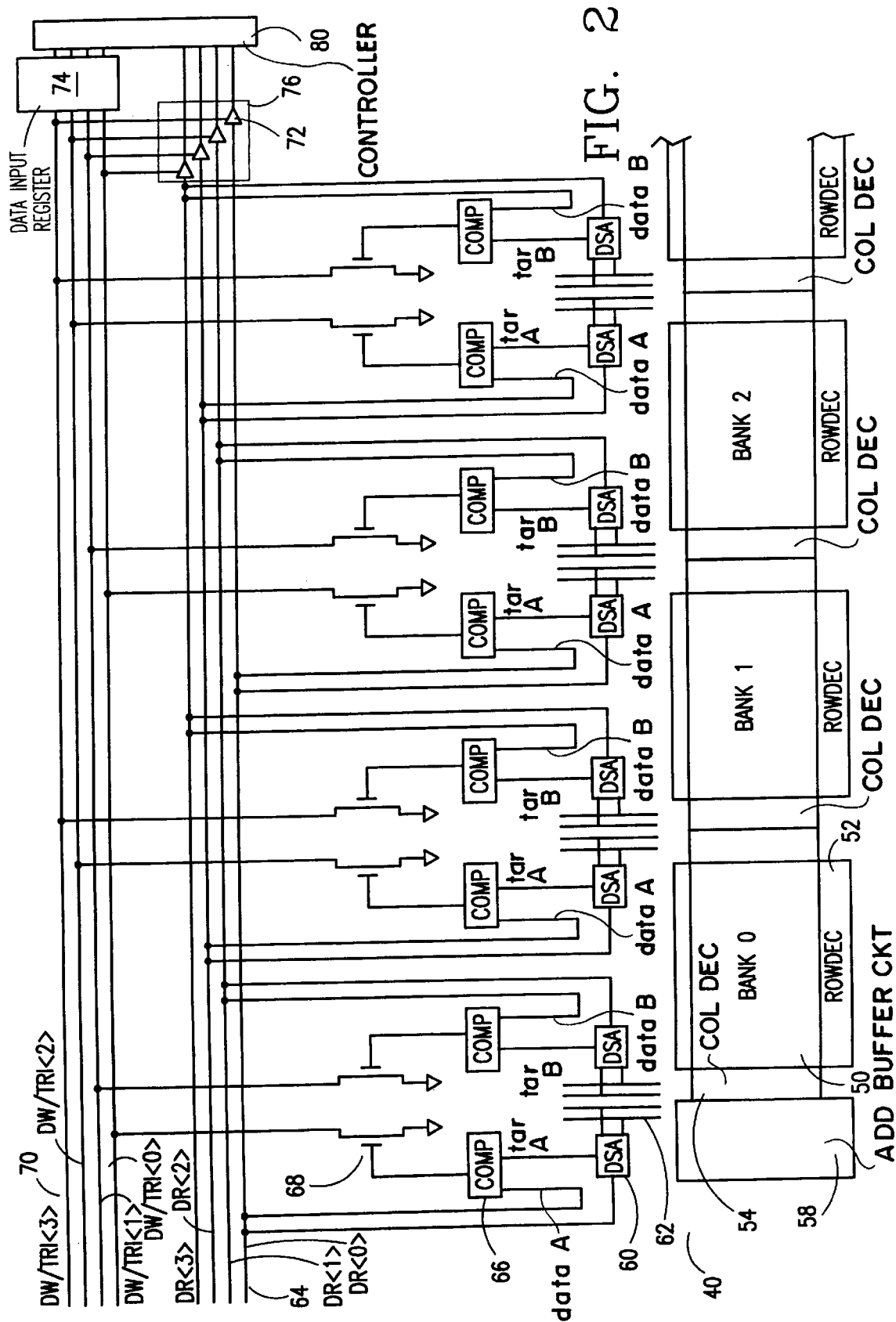
FIG. 2 is a schematic block diagram of a memory test circuit according to the present invention.

A test circuit according to the present invention is illustrated generally at 40 in FIG. 2 in schematic block diagram form. A random access memory device includes a plurality of memory bank 50 arrays, e.g. bank 0, bank 1, bank 2 . . . , each of which comprises storage cells organized in rows and columns for storing data. Data is written into a cell during a write operation via data input register 74, while determining the value of the contents of a cell is done during a read operation via data output register 76. Data output register 76 is comprised of a plurality of tri-state buffers 72. Each cell is addressable, i.e. responsive to address select signals.

Logic is necessary to decode address inputs to ensure that only a single cell outputs its contents when data is being read from the memory, and only a single cell has data stored in it when data is being written into the memory. In a memory array utilizing two-level decoding, two decoders are required. A row decoder 52 selects a physical word consisting of the number of bits in a row of the memory array, while a column decoder 54 selects one logical word, consisting of the number of bits of a physical word that are sensed and gated to the output one at a time, from the selected physical word.

The row decoder 52 and the column decoder 54 decode the memory address provided from address buffer circuit 58 to activate the cell for read or write transfer operations.

At the start of a memory test operation, a predetermined test data pattern consisting of high binary logic voltage levels (high logic level) and/or low binary logic voltage levels (low logic level) is concurrently written into each of the cells of the memory bank arrays 50 via data input register 74 and stored, as is well known in the art. Controller 80 will specify a plurality of addresses utilizing address compression, from which data sense amplifiers 60 will sense the data contained within each cell via bit lines 62. The data sense amplifiers 60 will output the data sensed within the specific cells from a first selected group of memory bank arrays 50 to one of a plurality of data read lines 64. The group of memory bank arrays 50 selected will be such that the data output (labeled data A or data B) from each data sense amplifier 60 will be conducted on a separate data read line 64. Thus, each data read line will carry only the data from a specific address of one memory bank array 50.

If the memory test is being done in a so-called compressed mode, banks of memory locations are tested in parallel with the memory locations of one bank being tested against those of another. Utilizing a compressed mode, once the read data (data A or data B) has been conducted to the data read lines 64, the data read from a second group of memory bank arrays 50 separate from and parallel to the first group (labeled tdr A or tdr B) is output to a plurality of comparators 66. Each comparator 66 will also read the data from the first group of memory bank arrays 50 carried on one of the data read lines 64. Comparators 66 will then compare the data from the first group of memory bank arrays (data A or data B) to the data from the second group of memory bank arrays (tdr A or tdr B). Thus, the stored data from cells of different memory banks will be compared with one another to determine if the data is coincident or non coincident.

The output of each comparator 66 is connected to the gate of a transistor 68. The drain of each transistor 68 is connected to one of a plurality of shared data write/tri-state control lines 70. The source of each transistor 68 is connected to ground. The data write/tri-state control lines 70 are idle during a read operation, remaining at a HIGH logic level. The shared data write/tri-state control lines 70 are output to the enable pins of tri-state buffers 72 contained in data output register 76. Tri-state buffers 72 are enabled when the signal on the enable pin is HIGH logic level. When tri-state buffers 72 are enabled, the data carried on data read lines 64 is output from tri-state buffers 72 to controller 80. If tri-state buffers 72 are not enabled, the resulting signal output from tri-state buffers 72 to controller 80 is a tri-state signal, i.e. neither HIGH logic nor LOW logic. Controller 80 is used to interpret the signal input from the tri-state buffers 72 during the memory test read operation.

In the compressed mode, the comparison of the data by comparator 66 will result in the output of one of two signals from each comparator 66 to its associated transistor 68. Should the compared data be coincident, indicating proper memory operation, the signal sent from each comparator 66 to its associated transistor 68 will maintain the transistor 68 in an OFF state. The data write/tri-state control line 70 to which each transistor 68 drain is connected will remain at a HIGH logic state. Tri-state buffer 72 to which the data write/tri-state control line 70 is connected will be enabled, thus the data carried by the data read line 64 will be input into controller 80. Controller 80 will interpret the data input, whether a HIGH logic state or a LOW logic state, as proper memory function and will not indicate an error in the memory operation.

If the compared data is non coincident, indicating a memory operation failure, the signal sent from that comparator 66 to its associated transistor 68 will turn that transistor 68 ON. The data write/tri-state control line 70 to which the drain of that transistor 68 is connected will be pulled to a LOW logic level by the turning on of the transistor 68. Tri-state buffer 72 to which the data write/tri-state control line 70 is connected will not be enabled due to the LOW logic signal input from the data write/tri-state control line 70. Thus, the output of tri-state buffer 72 to controller 80 will be a tri-state signal, i.e. neither HIGH logic level nor LOW logic level. The controller 80 will interpret the tri-state signal as a memory operation failure. The controller 80 consequently will indicate a memory operation error.

The determination of which cell is improperly functioning will be made by controller 80 depending upon which of the tri-state buffers 72 is not enabled. Since the transistors 68 for each memory test circuit are connected to a specific data write/tri-state control line 70 which in turn are connected to specific tri-state buffers 72, the information of the specific tri-state buffer 72 and memory addresses read as specified by the controller 80 will provide sufficient information for the controller 80 to determine which of the cells is improperly functioning.

In a non-compressed mode, the banks of each memory location will be tested one at a time, with the memory location of each bank being tested by the controller 80 against the predetermined test data pattern previously written into the memory banks. In the non-compressed mode, the data read from a memory bank will be carried on the data read lines 64. The shared data write/tri-state control lines 70 are idle during a read operation, remaining at a HIGH logic level. The shared data write/tri-state control lines 70 are output to the enable pins of tri-state buffers 72. Tri-state buffers 72 are enabled when the signal on the enable pin is HIGH logic level. When tri-state buffers 72 are enabled, the data carried on data read lines 64 is output from tri-state buffers 72 to controller 80. Since the data write/tri-state control lines 70 remain at a HIGH logic state during the non-compressed mode, tri-state buffers 72 are enabled. The data carried on data read lines 64 will be output through tri-state buffers 72 to controller 80 which will determine if the data read is coincident with the test data pattern previously written into the memory banks. Should the data be coincident, the controller 80 will not indicate a memory operation failure. If the data read is not coincident with the test data signal, the controller 80 will indicate a memory operation failure.

Figure 3:
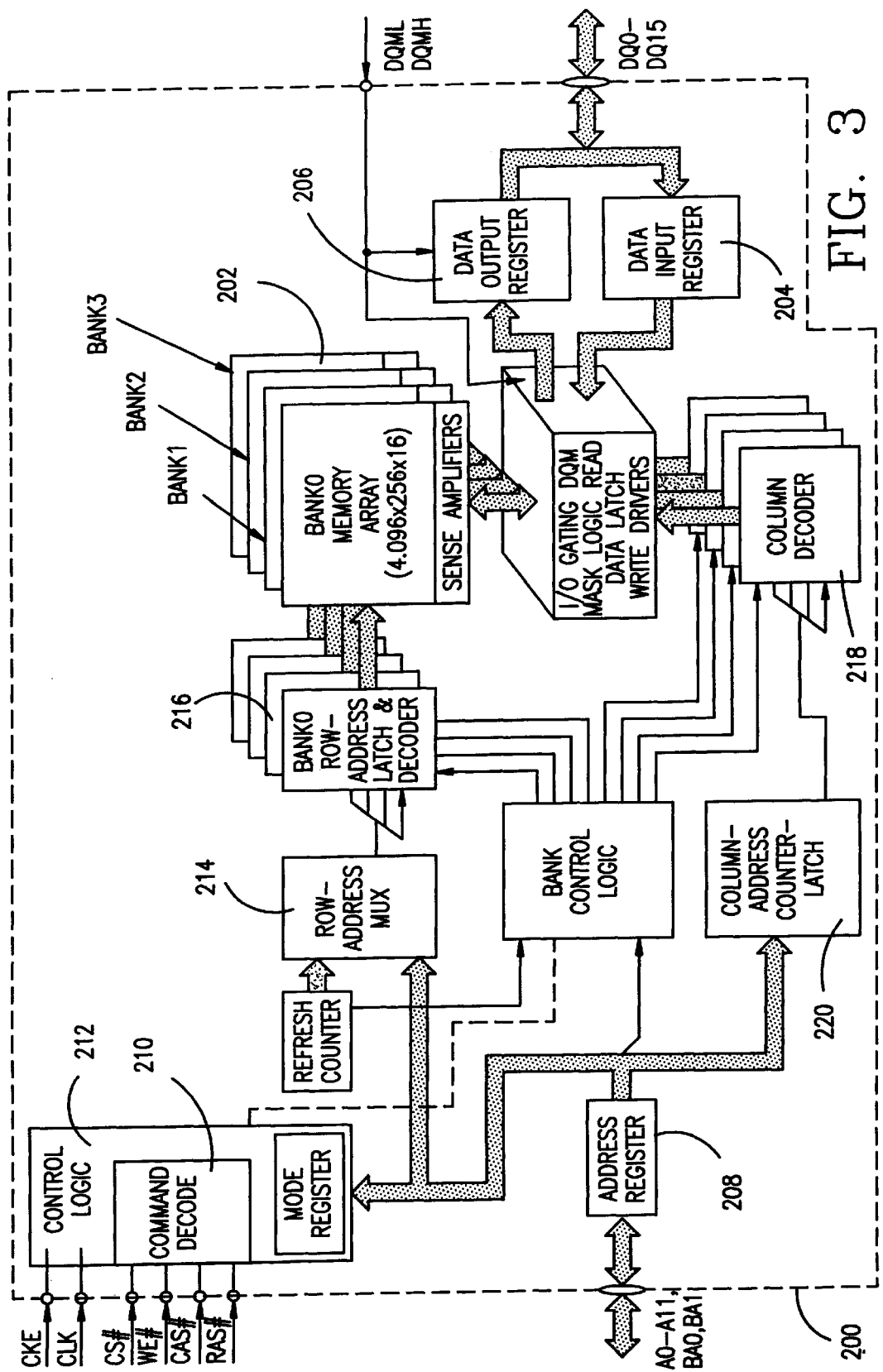
FIG. 3 is a functional block diagram of a memory device utilizing the present invention.

A typical memory device which would include a test circuit according to the present invention is illustrated generally at 200 in FIG. 3 in functional block diagram form.

The memory device depicted is a Synchronous Dynamic Random Access Memory (SDRAM) organized as a 4 meg, 16 bit memory. Bank memory arrays 202 include storage cells organized in rows and columns for storing data. Command decoder 210, included in a command controller 212, receives control signals to place command controller 212 in a particular operation sequence. Command controller 212 controls the various circuitry of SDRAM 200 based on decoded commands such as during controlled reads or writes from or to bank memory arrays 202. A specific address to determine the bank for which a read or write command is to occur is controlled via address register 208. A row address multiplexer 214 provides a row address to row decoder 216. Row decoder 216 decodes the row address from the row address multiplexer 214 to activate one of the lines corresponding to the row address for read or write transfer operations. Column decoder 218 activates lines corresponding to the column address for read or write transfer operations as provided by column address counter 220. Data is written into the storage cells via a data input register 204 and read from the storage cells via a data output register 206.

The test circuit illustrated generally in FIG. 2 is used to perform testing of the bank memory arrays 202 to determine proper operation. At the beginning of the memory test sequence, the predetermined test data pattern would be written into each cell of each memory bank 202 via the data input register 204. The test circuit and method as substantially described herein in reference to FIG. 2 would be used to perform a memory test to determine that each memory bank array 202 is functioning properly. The output of the memory test circuit would be carried by a shared data write/tri-state control data line, thus removing the need for separate lines to carry the results of the memory test circuit to the controller.

The present invention is not limited to DRAMs, as the present invention is equally applied to other random access memories such as a Static Random Access Memory (SRAM).

Figure 4:
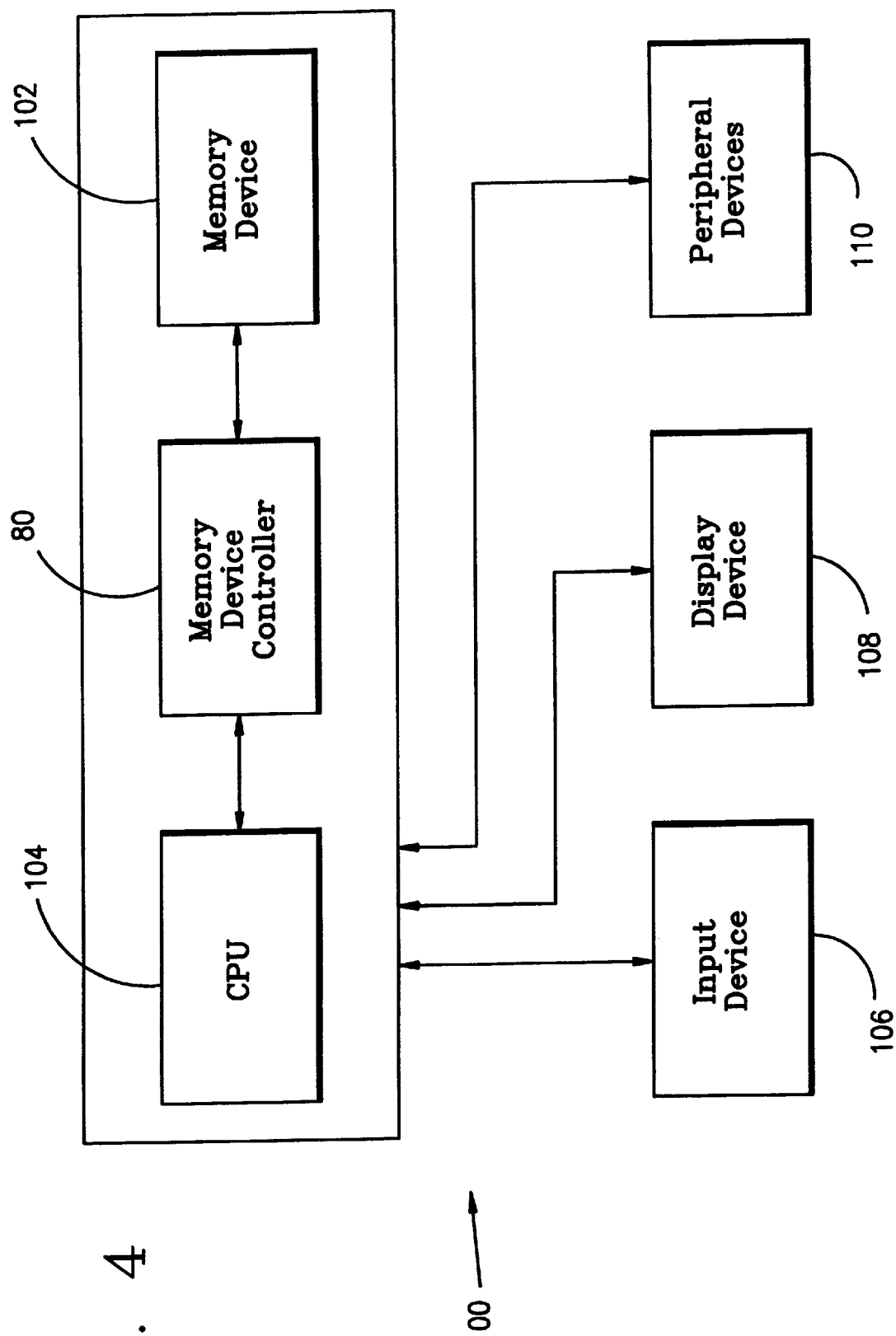
FIG. 4 is a block diagram of a typical processor controlled system in which the present invention would be used.

A typical processor system which includes a memory device with a test circuit according to the present invention is illustrated generally at 100 in FIG. 4 in block diagram form. A computer system is exemplary of a device having digital circuits which include memory devices. Most conventional computers include memory devices permitting the storage of significant amounts of data. The data is accessed during operation of the computers. Other types of dedicated processing systems, e.g. radio systems, television systems, GPS receiver systems, telephones and telephone systems also contain memory devices which can utilize the present invention.

A processor system, such as a computer system, generally comprises a memory device 102, a controller 80, a central processing unit (CPU) 104, input devices 106, display devices 108, and/or peripheral devices 110. It should be noted that a system may or may not include some or all of the aforementioned devices, and may or may not include multiple devices of the same type.

Memory device 102 includes a memory device with a test circuit 40 according to the present invention. The memory device 102 is connected to a controller 80, which is connected to CPU 104. CPU 104 controls the aspects of the processor system.

A memory test operation would be performed in the memory device substantially as hereinbefore described. The results of the memory operation test would be carried by shared data write/tri-state control lines to tri-state buffers which will output a signal based on the results to controller 80, which will consequently interpret the results to determine if there is a memory operation failure. The controller 80 would then output a signal to CPU 104 indicating the results of the memory test.

Reference has been made to a preferred embodiment in describing the invention. However, additions, deletions, substitutions, or other modifications which would fall within the scope of the inventions defined in the claims may be found by those skilled in the art and familiar with the disclosure of the invention. Any modifications coming within the spirit and scope of the following claims are to be considered part of the present invention.

What is claimed as new and desired to be protected by Letters Patent of the United States is:

1. A method for testing a semiconductor memory comprising a plurality of parallel memory bank arrays each including a plurality of memory cells, and a plurality of data read lines and a plurality of data write lines for respectively reading data into and out of said memory cells, said method comprising the steps of:

writing test data into each of said plurality of memory cells, said plurality of memory cells storing said test data;

reading said stored test data from a plurality of said memory cells from different ones of said parallel memory bank arrays;

comparing said stored test data read from each of said plurality of said memory cells from said different ones of parallel memory banks to each other; and outputting a signal representing the result of said comparing step over said data write lines to a memory controller.

2. The method according to claim 1 further comprising the steps of:

determining whether said compared stored test data is coincident or non coincident;

outputting a signal representing whether compared data is coincident or non coincident to said memory controller utilizing said data write lines; and reading said signal by said memory controller, said controller indicating proper memory functioning based upon said coincidence or non coincidence of said comparison.

3. The method according to claim 2, said step of outputting a signal further comprising enabling a buffer with said signal carried by said data write line as a result of said memory test, said buffer outputting a buffer signal to said memory controller.

4. A method for testing a semiconductor memory comprising a plurality of parallel memory bank arrays each including a plurality of memory cells, and a plurality of data read lines and a plurality of data write lines for respectively reading data into and out of said memory cells, said method comprising the steps of:

writing test data into each of said plurality of memory cells, said plurality of memory cells storing said test data;

reading said stored test data from said plurality of memory cells;

enabling a buffer utilizing said data write lines to input said read stored test data into a controller; and determining whether said stored test data read from said plurality of said memory cells is coincident or non-coincident to said test data retained by said controller.

5. A method for testing a semiconductor memory, said semiconductor memory comprising a plurality of memory bank arrays each including a plurality of memory cells, and a plurality of data read lines and a plurality of data write lines for respectively reading data into and out of said memory cells, said method comprising the steps of:

writing test data into each of said plurality of memory cells, said plurality of memory cells storing said test data;

sensing said stored test data from one of said plurality of memory cells from said parallel memory bank arrays;

conducting said stored test data on one of said plurality of data read lines to a buffer;

enabling said buffer to output said stored test data to a memory controller utilizing one of said plurality of data write lines; and comparing said stored test data to said test data retained by said memory controller.

6. A method for testing a semiconductor memory, said semiconductor memory comprising a plurality of memory bank arrays each including a plurality of memory cells, and a plurality of data read lines and a plurality of data write lines for respectively reading data into and out of said memory cells, said method comprising the steps of:

writing test data into each of said plurality of memory cells, said plurality of memory cells storing said test data;

sensing said stored test data from one of said plurality of memory cells from a first of said parallel memory bank arrays;

conducting said sensed stored data on one of said data read lines, said one of data read lines carrying said sensed stored data;

comparing said stored test data carried on said one of data read lines to stored test data sensed from a memory cell of a second of said parallel memory bank arrays;

outputting a signal representing the result of said comparing step over one of said data write lines to a buffer; and enabling or disabling said buffer to output a buffer signal to a controller, wherein said controller interprets said buffer signal to determine whether said semiconductor memory is operating properly.

7. The method according to claim 6 wherein said outputting step comprises:

activating a switch to conduct a signal representing the result of said comparing step to said buffer utilizing one of said data write lines.

8. The method according to claim 7 further comprising the steps of:

determining whether said compared stored test data from said data read line is coincident or non coincident with said stored test data sensed from said memory cell of said second parallel memory bank array;

turning on a normally off switch should said compared data be non coincident; and maintaining said normally off switch in an off position should said compared data be coincident, whereby said maintaining of said switch in an off state or turning on of said switch produces a signal carried over said data write line to said buffer.

9. The method in accordance with claim 8, wherein the step of turning on said normally off switch further comprises:

changing said data write line from a first logic state to a second logic state, disabling said buffer by said change of state of said data write line; and outputting a tri-state signal from said buffer to said controller, said controller interpreting said tri-state signal from said buffer to be a memory operation failure.

10. The method in accordance with claim 8, wherein the step of maintaining said normally off switch in an off position further comprises:

maintaining said normally idle data write line in a first logic state, enabling said buffer by said maintaining of said normally idle data write line in said first logic state; and outputting a HIGH logic signal or LOW logic signal from said buffer to said controller, said controller interpreting said HIGH logic signal or said LOW logic signal from said buffer to be proper memory operation.

11. A method for testing the memory of a processor system, said processor system comprising a central processing unit, a memory device controller, and a memory device which includes a self test circuit, said memory device comprising a plurality of parallel memory bank arrays each including a plurality of memory cells, a plurality of data read lines and a plurality of data write lines for respectively reading data into and out of said memory cells, said method comprising the steps of:

writing test data into each of said plurality of memory cells, said plurality of memory cells storing said test data;

reading said stored test data from a plurality of said memory cells from different ones of said parallel memory bank arrays;

comparing said stored test data read from each of said plurality of said memory cells from said different ones of parallel memory banks to each other;

outputting a signal representing the result of said comparing step over said data write lines to a buffer;

outputting a signal from said buffer to said memory controller; and interpreting with said memory controller said signal from said buffer as a result of said comparison to determine whether said semiconductor memory is operating properly.

12. A test circuit for a memory device, said test circuit comprising:

a plurality of data sense amplifiers for sensing data stored in a plurality of memory cells of said memory device;

a plurality of data read lines for conducting said sensed data, said plurality of data read lines connected to a controller through a data output register, said data output register comprised of a plurality of buffers corresponding to each of said plurality of data read lines, each of said plurality of buffers having an enable pin;

a plurality of data write lines for writing data into said memory cells, each of said data write lines also being connected to said enable pin of said buffers;

a plurality of comparators for comparing said sensed data, said comparison producing a result; and circuitry for coupling a signal from said comparators representing said result of said comparison to said buffer enable pins via said data write lines.

13. The test circuit according to claim 12, further comprising:

a plurality of switches, each connected between one of said comparators and one of said data write lines, said switches being activated in response to said signal from said comparators such that switch activation causes a switch signal from each of said switches to be conducted on said one data write lines to said buffer.

14. A semiconductor memory device including a self test circuit, said semiconductor memory device comprising:

a plurality of parallel memory bank arrays each including a plurality of memory cells arranged in rows and columns, each of said memory cells being addressable by a row address and a column address;

a plurality of data sense amplifiers having an input and a first and second output, said input of said data sense amplifiers being connected to said plurality of memory bank arrays;

a controller;

a plurality of data write lines connected to said controller through a data input register;

a plurality of data read lines;

a data output register comprised of a plurality of buffers connecting said data read lines to said controller, said buffers being enabled by a signal carried on said data write lines; and a plurality of memory self test circuits, said memory self test circuits comparing data stored in different memory cells and producing an output signal based on said comparison, said output signal carried by said data write lines through said data output register to said buffers.

15. The semiconductor memory device according to claim 14, said self test circuit further comprising:

a plurality of comparators each having a first and second input and an output, said first input connected to said first output of one of said data sense amplifiers, said second input connected to said one of said plurality of data read lines, said comparators comparing data carried on said one of said plurality of data read lines to data sensed by said one of data sense amplifiers and outputting a signal representing said comparison to one of said data write lines.

16. The semiconductor memory device according to claim 15, further comprising:

a plurality of switches each connected between said one of said data write lines and ground, each of said switches operating in response to a signal received from an output of a respective comparator to cause said one of said data write lines to change states should said compared data be non coincident, said buffer being disabled by said change of state of said one of said data write lines, said controller interpreting said disabling of said buffer as a memory operation failure.

17. A semiconductor memory device which includes a self test circuit, said semiconductor memory device comprising:

a plurality of parallel memory bank arrays each containing a plurality of memory cells arranged in rows and columns, each of said memory cells being addressable by a row address and a column address;

a plurality of data sense amplifiers each having an input and output, each of said input connected to a respective one of said plurality of parallel memory bank arrays;

a plurality of data read lines;

a data input register comprised of a plurality of buffers connecting said data read lines to a controller, said buffers having an enable input;

a plurality of data write lines, each of said plurality of data write lines connected to said enable pin on one of said buffers; and a plurality of self test circuits, each connected to a respective output of said data sense amplifiers and one of said plurality of data write lines, each of said self test circuits utilizing one of said plurality of data write lines to conduct a memory failure signal output by said self test circuit.

18. The semiconductor memory device according to claim 17, said self test circuits further comprising:

a plurality of comparators each having a first and second input and an output, said first input connected to said first output of one of said data sense amplifiers, said second input connected to said one of said plurality of data read lines, said comparators comparing data carried on said one of said plurality of data read lines to data sensed by said one of data sense amplifiers and outputting a signal representing said comparison to one of said data write lines.

19. The semiconductor memory device according to claim 18, further comprising:

a plurality of switches each connected between said one of said data write lines and ground, each of said switches operating in response to a signal received from an output of a respective comparator to cause said one of said data write lines to change states should said compared data be non coincident, said buffers being disabled by said change of state of said one of said data write lines, said controller interpreting said disabling of said buffers as a memory operation failure.

20. A semiconductor memory device comprising:

a plurality of parallel memory banks, each of said memory banks including a plurality of memory cells arranged in rows and columns, each of said memory cells being addressable by a row address and a column address;

a plurality of data write lines for writing data into said memory cells;

a plurality of data read lines for reading data from said memory cells;

a controller connected to said plurality of data write lines via a data input register; and a data output register comprised of a plurality of buffers, each of said buffers having an input, an output and an enabling pin, said input connected to one of said plurality of data read lines, said output connected to said controller, and said enabling pin connected to one of said plurality of data write lines;

a plurality of test circuits each with a first and second input and an output, said first input of each test circuit connected to one of said memory cells of a parallel memory bank, said second input of each test circuit being connected to one of said plurality of data read lines receiving data from a memory cell of a second memory bank, said output of each test circuit connected to one of said plurality of data write lines, each of said test circuits comparing data from one of said memory cells of a first memory bank to one of said memory cells of a second memory bank, said comparison resulting in an output signal conducted by one of said data write lines to said enabling pin of one of said buffers, said buffers outputting a buffer signal based on said signal conducted by one of said data write lines, said controller interpreting said buffer signal to determine said result of said comparison.

21. A semiconductor memory device comprising:

a plurality of memory cells arranged in rows and columns, each of said memory cells being addressable by a row address and a column address;

a plurality of data write lines for writing data into said memory cells;

a plurality of data read lines for reading data from said memory cells;

a controller connected to said plurality of data write lines through a data input register;

a data output register comprised of a plurality of buffers each with an input, an output, and an enabling input, said input connected to one of said plurality of data read lines, said output connected to said controller, said enabling input connected to one of said plurality of data write lines; and a plurality of test circuits each with a first and second input and an output, said first input of each test circuit connected to receive data from one of said memory cells, said second input of each test circuit connected to receive data from another of said memory cells, said output of each test circuit connected to one of said plurality of data write lines, each of said test circuits comparing data from one of said memory cells to another of said memory cells, said comparison resulting in an output signal conducted by one of said data write lines to one of said buffers, said one of said buffers outputting a signal based on said comparison to said controller.

22. A semiconductor memory device comprising:

a plurality of memory cells arranged in rows and columns, each of said memory cells being addressable by a row address and a column address;

a plurality of data write lines for writing data into said memory cells;

a plurality of data read lines for reading data from said memory cells;

a controller connected to said plurality of data write lines through a data input register;

a data output register comprised of a plurality of buffers each with an input, an output, and an enabling input, said input connected to one of said plurality of data read lines, said output connected to said controller, said enabling input connected to one of said plurality of data write lines, said buffers being enabled by said data write lines to output a signal based on data carried by said data read lines read from one of said memory cells to said controller.

23. A processor system comprising:

a central processing unit;

a memory device connected to said central processing unit to receive data from and supply data to said central processing unit over data write and data read lines, said memory device containing memory cells for storing data; and a memory device self test circuit for checking the operativeness of said memory cells, said self test circuit utilizing one of said data write lines to conduct results of a self test to a memory device controller.

24. The processor system according to claim 23, said self test circuit further comprising:

a plurality of data sense amplifiers for sensing data stored in said memory cells of said memory device;

a plurality of comparators for comparing said sensed data, said comparison producing a result; and circuitry for coupling a signal from said comparators representing said result of said comparison to said controller through buffers via said data write lines.

25. The processor system according to claim 24, said self test circuit further comprising:

a plurality of switches, each connected between one of said comparators and one of said data write lines, said switches being activated in response to said signal from said comparators such that switch activation causes a switch signal from each of said switches to be conducted on said one data write lines to said memory device controller via one of said buffers.

* * * * *